United States Patent [19]

Zablotny et al.

[11] Patent Number: 5,772,838
[45] Date of Patent: Jun. 30, 1998

[54] APPARATUS AND METHOD FOR MAKING LAMINATED ELECTRICAL OR ELECTRONIC DEVICES FROM A CONTINUOUS TAPE COATED ON ONE SIDE WITH CERAMIC MATERIAL

[75] Inventors: Gordon O. Zablotny, Escondido; James W. Horner, Oceanside, both of Calif.

[73] Assignee: Pacific Trinetics Corporation, San Marcos, Calif.

[21] Appl. No.: 535,622

[22] Filed: Sep. 28, 1995

[51] Int. Cl.[6] ................................................. B32B 31/00
[52] U.S. Cl. .................... 156/512; 156/510; 156/516; 156/519; 156/522; 156/530; 156/538; 156/543; 156/509; 83/215; 83/218; 83/277
[58] Field of Search .................................. 156/157, 506, 156/505, 519, 518, 520, 530, 510, 516, 522, 538, 543; 425/290; 83/215, 225, 218, 272, 277

[56] References Cited

U.S. PATENT DOCUMENTS

| | | | |
|---|---|---|---|
| 4,385,959 | 5/1983 | Goguer | 156/506 |
| 4,861,657 | 8/1989 | Nishino et al. | 428/336 |
| 4,990,080 | 2/1991 | Kakimoto | 425/290 |
| 5,254,413 | 10/1993 | Marticocchi | 428/633 |

FOREIGN PATENT DOCUMENTS 0530052  3/1993  European Pat. Off. .

*Primary Examiner*—Merrick Dixon
*Attorney, Agent, or Firm*—Brown, Martin, Haller & McClain, LLP

[57] ABSTRACT

Apparatus and a method for production of laminated electronic or electrical devices are described which enables one thin patterned or unpatterned substrate to be easily and accurately incorporated into a previous stack of substrates by registration of a coated tape from which the substrate is excised. In the present invention the tape is indexed to a fixed position and then a platen with the previously stacked substrates is brought into registration with the stationary tape, following which the substrate is excised from the coated tape and added to the stack of substrates. Since the tape always is positioned in the equipment as indexed at the same location with each indexing step, and since once indexed the tape does not move, the platen can be brought into accurate alignment and registration with the tape. This invention lends itself to the manufacture of virtually any type of capacitor, semiconductor chip, integrated circuit, printed circuit board or similar electrical or electronic device which is formed of successive, aligned and registered layers, all bonded into a unitary device. The scope is limited only by the different circuits which can be printed or otherwise incorporated onto the ceramic substrate.

14 Claims, 4 Drawing Sheets

APPARATUS AND METHOD FOR MAKING LAMINATED ELECTRICAL OR ELECTRONIC DEVICES FROM A CONTINUOUS TAPE COATED ON ONE SIDE WITH CERAMIC MATERIAL

BACKGROUND OF THE INVENTION

1. Field of the Invention

The invention herein relates to the manufacture of laminated electrical and electronic devices such as semiconductor chips and capacitors. More particularly it relates to apparatus and methods for rapidly, automatically and economically accomplishing such manufacture.

2. Description of the Prior Art

Many electrical devices such as semiconductor chips, capacitors and the like are formed from multiple individual layers ("patterned substrates") of ceramic substrates on which is imprinted the desired electronic circuitry. The individual leaves are stacked together so that each layer of circuitry is sandwiched between two layers of insulating ceramic. The individual circuitry layers are then joined by electrical connections made either through holes in the ceramic substrates or by connections exterior to the laminated stack. (For brevity, these laminated electrical devices will often hereafter be referred to collectively as "capacitors." It will of course be understood, however, that the invention to be described is applicable to manufacture of all types of laminated electrical devices, not only capacitors. In addition, the patterned substrates and the "cover sheets" will often be referred to herein as "leaves".)

In practice, the individual capacitors are actually manufactured in the form of large wafers which contain dozens or hundreds of individual capacitors printed in a grid fashion. Once all the leaves have been stacked and laminated together, a wafer is sliced vertically so that each of the individual capacitors is separated from the wafer into a single device. Previously it has been common for such wafers to have dimensions of 3"×4" (76×102 mm) or greater, with each of the individual capacitors having dimensions of 0.120"×0.060" (3.0×1.5 mm; designated in the industry as a "1206" capacitor). Thus, a single laminated wafer might contain on the order of 1,000 individual capacitors which are subsequently sliced apart into individual devices.

In past practice, the individual leaves of printed ceramic substrates could be easily aligned and stacked together, since they had relatively large thicknesses, typically 1–10 mils (0.04–0.25 mm), and therefore were substantially rigid and easy to manipulate. However, recently two factors have arisen which have changed the situation dramatically. First, with the prior art thicker leaves, there was a tendency for air pockets to form between the layers caused by the raised printed electronic circuitry. As more leaves were added, the outer surfaces of the laminated stack tended to become irregular or wavy. The more leaves that were added (typically up to 30–50), the greater was the waviness, making registration of subsequent leaves in the manufacturing process that much more difficult.

Second, there has been a trend in the industry to require thinner and smaller laminated devices to increase capacity or conserve space. Much electrical and electronic equipment is designed to use laminated devices of specific external dimensions. Therefore, if the individual leaves can be made thinner, more leaves, and thus more capacity or complexity, can be incorporated into a laminated device while still maintaining the standard external device dimensions. Alternatively, in many cases there is a desire to have reduced external device dimensions, so that more devices can be incorporated into a piece of equipment without increasing the size of the piece of equipment or, with the same components, the piece of equipment itself can be made smaller. This is particularly important where the space in which the equipment is to be used is at a premium, such as in aircraft, spacecraft, satellites, computers, communication equipment and so forth. For instance, capacitor sizes have now been reduced to external dimensions such as 0.080"×0.050" (2.0×1.3 mm; "0805" capacitors) and 0.040×0.020 in. (1.0×0.5 mm: "0402" capacitors), as well as other intermediate sizes. It is still important, however, to be able to obtain the same electrical or electronic capability in the thinner and smaller capacitors.

As these laminated devices have become smaller and thinner, the individual ceramic substrates have also become thinner so that the individual leaves have been much more difficult to bring into registry with the other leaves during manufacture. The problem of registration and alignment has been sufficiently severe that production speeds have been substantially less than optimum so that overall yields of wafers have been reduced. In addition, because of the increasing problems with waviness, yields of the devices themselves have been further reduced by an increase in the numbers of unsatisfactory wafers which must be rejected. Since each wafer contains hundreds of individual devices, the loss of a single wafer represents a substantial reduction in the overall yield of the number of devices.

It would therefore be advantageous to have apparatus which could be used to bring the individual leaves quickly and accurately into registration for stacking. Such apparatus would be particularly desirable for use with thin leaves and where it could be fed by a continuous supply of such leaves substrates, could accurately and quickly align and register the individual leaves and stack them into an overall assembly of properly aligned leaves for subsequent bonding to form the unitary device.

SUMMARY OF THE INVENTION

The present invention avoids all of these problems of the prior art, and achieves the desired advantages to enable one thin patterned or unpatterned substrate to be easily and accurately incorporated into a previous stack of substrates or layers by registration of a coated tape from which the substrate is excised. In contrast to the prior art equipment which was intended to align each segment of tape with a stationary prior stack of substrates, which meant moving the tape toward the stationary stack, causing registration and alignment to be extremely difficult because of the thinness and flexibility of the coated tape, the present invention indexes the tape to a fixed position in the apparatus and then the platen with the previously stacked substrates is brought into registration with the stationary tape. Since the tape always is positioned in the equipment as indexed at the same location with each indexing step, and since once indexed the tape does not move, the platen can be brought into accurate alignment and registration with the tape and the prior art problems associated with attempting to make precise movements with a thin, flexible tape are entirely avoided.

In its broadest apparatus aspect, the invention is of apparatus for forming a laminated electrical or electronic device from a continuous tape coated on one side with a ceramic material, which comprises: tape positioning means for releasably positioning sequential indexed segments of the tape in a predetermined position; tape feed means for indexing the tape segments sequentially into and away from the position with the ceramic coated side facing a platen; the platen aligned with the position and moveable into and away from registration and contact with the ceramic coated side of the tape in the position; cutting means cooperative with the platen for excising a patterned or unpatterned substrate from the ceramic coating with which the platen is in registration and contact; transfer means for separating the substrate from the tape and transferring it to the platen; and drive means for moving the platen into the registration and contact, maintaining the registration and contact while the cutting means excises the substrate; moving the platen away from the registration with the substrate transferred thereto, and returning the platen into the registration and contact with a next sequential segment of the tape; whereby repetitive operation of the apparatus causes a plurality of the patterned or unpatterned substrates to be accumulated on the platen, the plurality of substrates being bonded into a laminated electrical or electronic device.

In its broadest method aspect, the invention is of a method for forming a laminated electrical or electronic device from a continuous tape coated on one side with a ceramic material, which comprises: providing an elongated tape having a ceramic coating covering one side thereof; indexing sequential segments of the tape into a predetermined position with the ceramic coated side facing a platen; moving the platen into registration and contact with the ceramic coated side of the tape in the position; excising a patterned or unpatterned substrate from the ceramic coating with which the platen is in registration and contact; separating the substrate from the tape and transferring it to the platen; and moving the platen away from the registration with the substrate transferred thereto, and returning the platen into the registration and contact with a next sequential segment of the tape; and repeating the preceding five steps to accumulate a plurality of the substrates on the platen, such that the plurality of substrates may thereafter be removed from the platen and bonded into a laminated electrical or electronic device.

The present invention lends itself to the manufacture of virtually any type of capacitor, semiconductor chip, integrated circuit, printed circuit board or similar electrical or electronic device which is formed of successive, aligned and registered layers, all bonded into a unitary device. The scope is limited only by the different circuits which can be printed or otherwise incorporated onto the ceramic substrate.

DETAILED DESCRIPTION OF THE PREFERRED EMBODIMENTS

Figure 1:
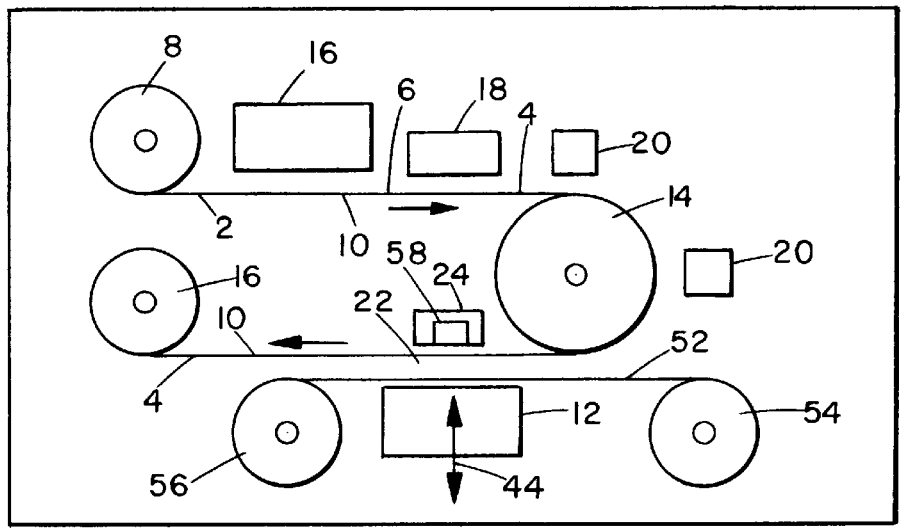
FIG. 1 is a schematic side elevational view illustrating an apparatus for making a laminated electronic device according to a preferred embodiment of the invention.
Figure 2:
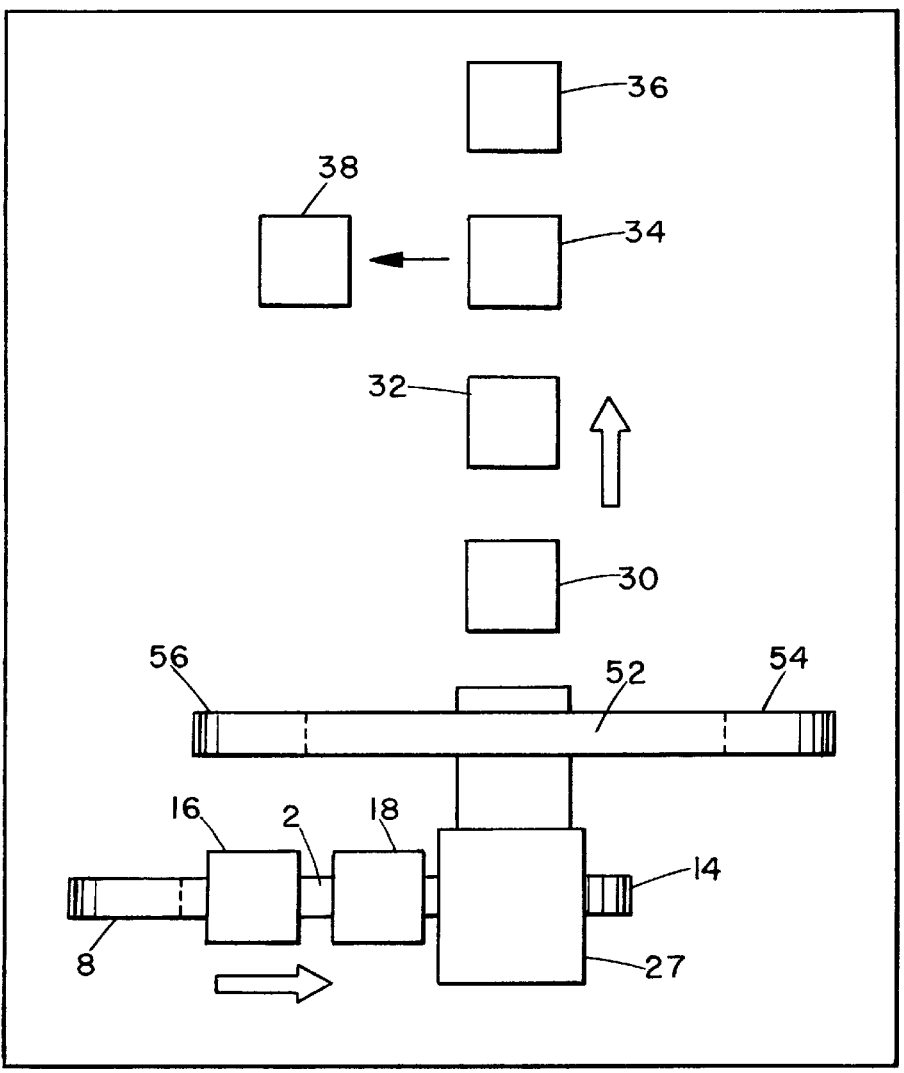
FIG. 2 is a schematic top plan view of the apparatus of FIG. 1.

The present invention will be best understood by reference to the drawings. FIGS. 1 and 2 illustrate the basic concepts of the invention and schematically represent the apparatus and steps used in the invention.

The feed material comprises a roll of flexible inert tape 2, most preferably polyester tape of the type commercially available under the trademark Mylar®. Coated completely across one surface or side 4 of the tape is a thin layer of ceramic material which will become the substrate for each leaf. The particular ceramic material will be a matter of choice, since such ceramics are well known in the electronics industry. In the present invention, the ceramic layer 6 is preferably approximately 10–25 $\mu$m thick, although thicker layers can be used if their flexibility and ability to conform to the tape curvatures and the changes of direction through the equipment can be accommodated, and thinner layers can also be used if they can maintain uniform coverage of the tape surface 4 and provide the requisite electrical properties. The roll of coated tape 2 is initially wound on a feed roller 8 and is fed into the equipment with the backing side 10 and ceramic coating side 4 aligned such that when the platen 12 is reached, the ceramic coating side 4 will be facing the platen. A drive roller 14 or similar device moves the coated tape 2 through the system, at the end of which the discarded remainder of the tape 2 is wound on a rewind roll 16 for salvage or disposal.

As the tape leaves the feed roller 8, it first passes to a print mechanism 16, which applies the desired electrical circuitry onto the ceramic layer 6. The method of application is not critical to the present invention, and any suitable method of application of the circuitry can be used. Pre-printed rolls of tape may alternatively be used. Since the entire tape 2 is being indexed through the system in discrete steps, the print mechanism 16 is placed so that when the tape 2 stops for one index step at the platen 12, the print mechanism 16 is simultaneously positioned to print the desired circuitry for a subsequent patterned substrate on the stopped portion of the ceramic layer 6 directly in registry with it. As the tape 2 is indexed forward, it also preferably stops intermittently in front of an inspection station 18 where the printed electrical circuitry is inspected for flaws either visually or by electronic vision systems. The tape 2 continues to index forward and passes by process heaters 20 which are intended to dry the printed circuit and make it amenable to tacking at the platen 12.

When an individual segment which is to become a patterned substrate of leaf reaches position 22 in alignment with platen 12, a portion of the Mylar® tape is held by vacuum to a positioning block 24 to maintain the coated tape 2 in a fixed predetermined position in alignment with the platen 12. The platen 12 is raised so that the ceramic substrate of the top leaf 28 of previously excised patterned substrate comes into contact with the electrical circuitry and ceramic coating layer of the portion of the patterned ceramic coating which is to form the next leaf of the laminate and is braced against the anvil 24. A cutting device 26 surrounds the perimeter of the platen 12 and moves into contact with the ceramic layer 4 and makes a perimeter cut all the way around the area of patterned ceramic layer to be excised as the next patterned substrate or leaf. The incision which is cut goes completely through the ceramic coating layer 4, but only partially into the Mylar® tape backing. The platen 12 exerts some pressure against the tape, usually 0–3000 psi, and it is heat tacked through anvil 24, which is sufficient to adhere the patterned ceramic area within the perimeter incision strongly enough to the top layer 28 of patterned ceramic substrate already on the platen 12, such that as the platen 12 then is moved away from the coated tape 2, the portion of the ceramic layer 4 within the incised perimeter is excised from the tape 2 and moves away with the platen 12 to form the next layer 28 of the stacked laminate. The tape 2 is then indexed forward with the scrap Mylar® backing toward the rewind reel 16. These steps are repeated as many times as is necessary to build up the desired number of patterned substrates, commonly about 30–50, to form the wafer on the platen 12. Conveniently the platen 12 and anvil 24 and their associated operating mechanisms are contained in a housing 27.

The stacked plurality of layers lightly adhered together are then removed from the platen 12, dried in dryer 30 and laminated in hydrostatic lamination unit 32 at substantially higher pressure, up to 6000 psi (43.3 Mpa) over the entire wafer area to bond the entire wafer into a single unitary pad or bar. The pressure is preferably applied by a liquid bladder which provides a uniform and consistent high pressure across the entire plurality of layers so that the layers are evenly bonded throughout, and unbonded areas which would not otherwise have received sufficient pressure are avoided. A device particularly useful for this pressure bonding is described in U.S. Pat. No. 4,636,275 (Ronald A. Norell). The bonded laminate is then transferred to a slicer or blade 35 at station 34, which slices out the individual capacitors and sends them on for collection and sorting at transfer station 36. Waste material is discarded at 38.

FIGS. 1 and 2 also illustrate the application of a cover or blank, unprinted tape 52 to the platen 12 before the first cover sheet is excised and attached to the platen. The cover tape 52 is wound from feed reel 54 to take-up reel 56. The cover tape 52 also serves as a tacking base for assisting in holding the coated tape 2 in alignment with the platen 12 during excising of each leaf. The tape securing anvil 24 preferably has a plurality of point heating elements 58 that thermally tack the edges of tapes 52 together outside the coated area of ceramic layer 4 inside the area to be excised as the leaf. Once the leaf is excised, the tapes pull apart from the Mylar® carrier. This is repeated until the proper cover thickness is achieved.

In the present invention therefore, the entire system avoids the prior art problems of registration of thin materials with a previous stack of layers. In the past, machines known as printer/stackers were used to print tape and cut and stack wafers or segments of tape on a stationary prior stack of leaves. Since this meant moving the tape toward the stationary stack, registration and alignment were extremely difficult because of the thinness and flexibility of the coated tape. In the present invention however, the tape is indexed to a fixed position in the apparatus and then the platen with the previously stacked layers is brought into registration with the stationary tape. Since the tape always is positioned in the equipment as indexed at the same location with each indexing step, and since once indexed the tape does not move, the platen can be brought into accurate alignment and registration with the tape and the prior art problems associated with attempting to make precise movements with a thin, flexible tape are entirely avoided.

Another advantage of the present invention is that one automated machine or apparatus is used for the entire process of printing, inspection, stacking, excising, drying and laminating the stack, and trimming and cutting into individual capacitors or other electronic components. In the past, these steps were performed in separate machines, such as a printer/stacker machine, a separate laminator machine and so on. This required significant time and manual input. The apparatus and method of this invention carries out all the necessary functions in one, automated machine requiring no manual input.

Figure 4:
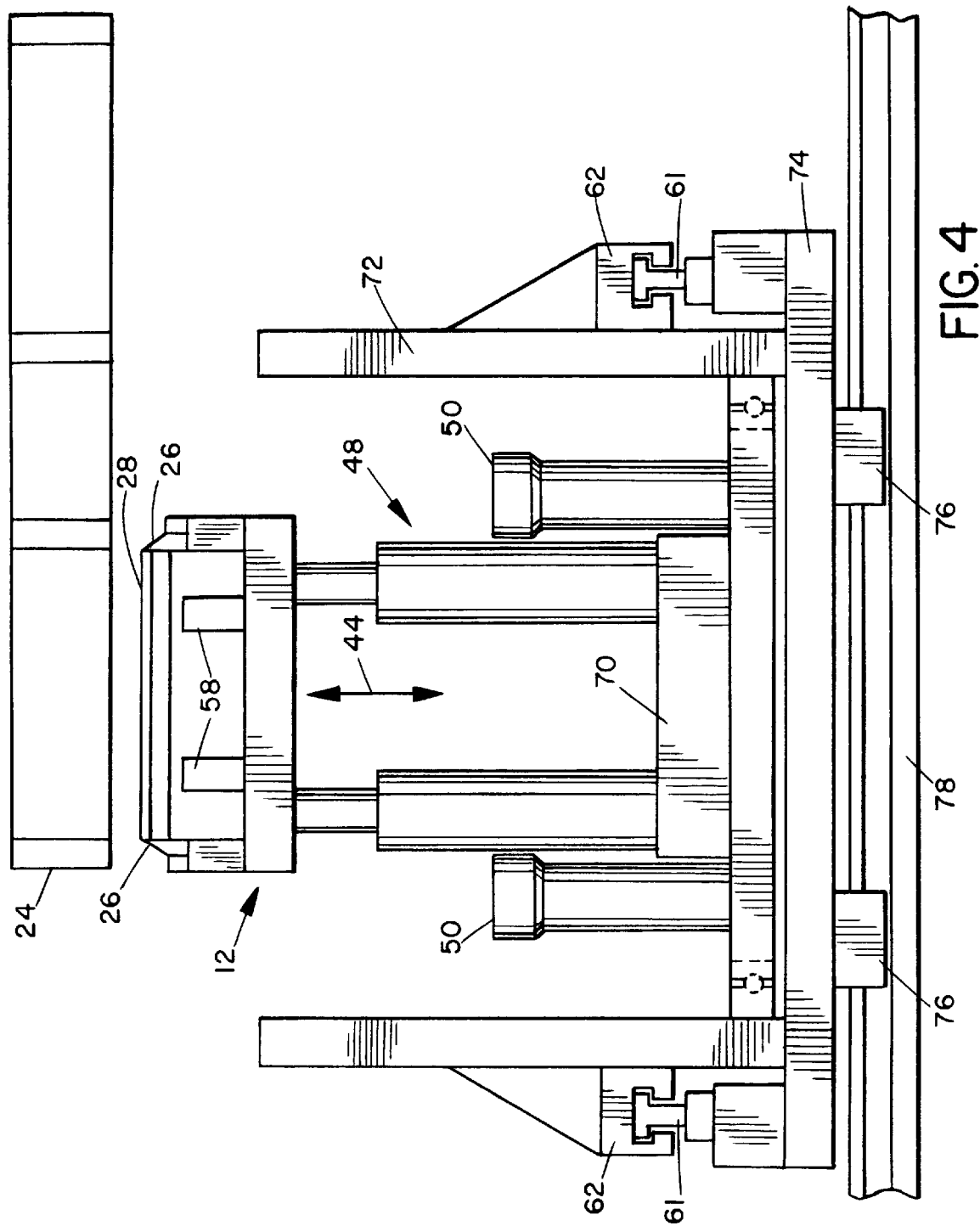
FIG. 4 is a side elevation view of the platen and cutting means of the present apparatus.
Figure 5:
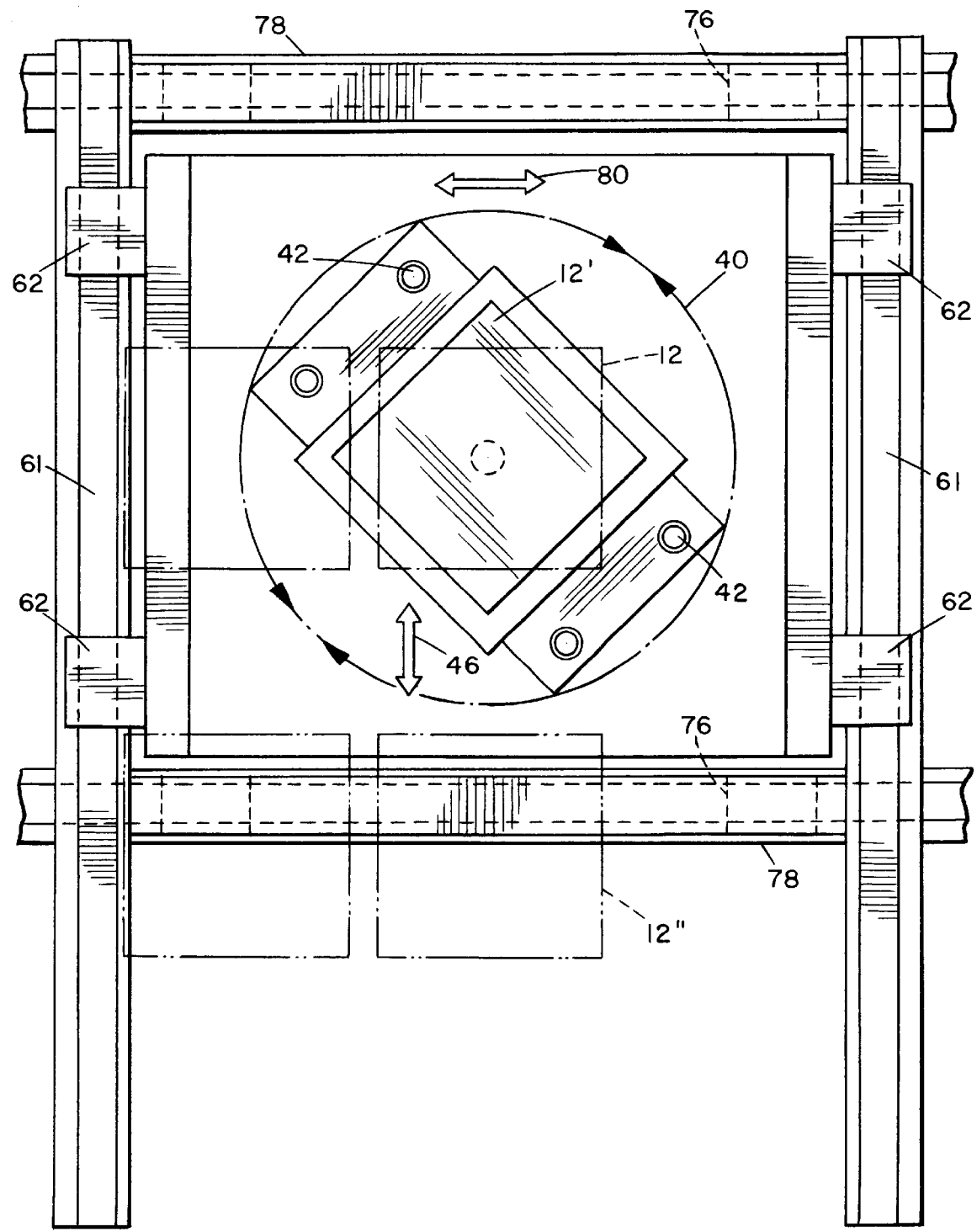
FIG. 5 is a top view of the platen, illustrating its ability to be rotated to bring successive patterned substrates and cover sheets into different alignments with each other.

FIGS. 4 and 5 illustrate the platen support and transport structure in more detail. The platen is supported via piston and cylinder mechanism 48 on base plate 70, which in turn is rotatably mounted on support frame 72. Support frame 72 is slidably mounted via sliding carriages or blocks 62 on slide rails 61 for movement in the direction of arrow 46 in FIG. 5. Slide rails 61, in turn, are mounted on a base plate 74 which is supported via carriages 76 on a second set of slide rails 78 which extend perpendicular to slide rails 61. This allows for movement of the platen in both the x and y directions and also rotational movement in the direction of arrow 40 in FIG. 5.

In many instances, it is desirable to have "overlap" of the successive electronic circuitry layers, where the successive leaves of patterned substrates are not in identical orientation. The equipment of the present invention easily accomplishes this, since the platen 12 is designed to be able to be rotated through any desired degree between each successive contact with the ceramic tape 2, as illustrated in FIG. 5. For instance, in the most common situations, between each successive contact with the coated tape 2, the platen 12 is rotated 180°, so that adjacent patterned substrates are oriented opposite to each other. This makes it particularly easy for instance, to form multi-layer capacitors, where the adjacent circuits are oriented opposite to each other, but each circuit is oriented in the same direction as the second successive circuit, so that the matches circuits alternate. Each of the two sets of like circuits can then all be electrically joined at their outer edges so that the resulting capacitor has two interleaved sets of electrical circuit layers.

In FIG. 5 the platen 12 is shown in its normal position, from which it can be moved vertically (into and out of the plane of the Figure) into and away from registration and contact with the tape 6. If rotation is desired, the platen 12 is rotated (by a motor not shown) as indicated at 12' to the desired alignment for the next contact with the tape 6. In FIG. 5 the platen at 12' has been rotated 45°, but full 360° rotation is available, as indicated by circle 40. Indexing guide markers or holes 42 are provided so that the rotation can be precisely controlled visually or by a vision system. Alternatively, if only certain orientations are desired, sensors can be provided at the designated angles to automatically stop the rotation where desired. Also, although the rotation is shown as bi-directional, in most cases it will be more convenient to have it unidirectional, especially where each rotation will be 180°.

Further, the platen 12 will also be moveable in both the x and y directions away from its vertical line of contact 44 with the printed tape 2, in the direction of arrows 46 and 80 in FIG. 5, along slide rails 61 and 78, respectively. FIG. 5 illustrates a displaced platen position 12". The horizontal movement permits the laminated wafer stack to be removed from the platen 12 after the last leaf or cover sheet has been added, so that the entire assembly can be moved on to drying and pressure bonding as described above. The platen 12 is then moved back to its normal position and the assembly of the next wafer can begin. This movement also permits the platen to be aligned with the non-printed cover tape 52.

The vertical movement of the platen 12 is illustrated in FIG. 4. The piston-and-cylinder system 48 moves the platen 12 vertically, as indicated by the center arrow 44. Alignment with the tape 6 is calibrated and controlled by cameras 50 which are focused on alignment holes or markers (not shown) in the tape positioning anvil 24. In fact, throughout the process there will be provision for inspection, not only by cameras 50 but also by other cameras or vision systems as needed, or by visual inspection by the workers operating the system.

The present invention lends itself to the manufacture of virtually any type of capacitor, semiconductor chip, integrated circuit, printed circuit board or similar electronic device which is formed of successive, aligned and registered layers, all bonded into a unitary device. The scope is limited only by the different circuits which can be printed or otherwise incorporated onto the ceramic layer 4 by the printing mechanism 16. It will be understood by those skilled in the art that "printing" as used herein in not limited to screen printing and the like, but also includes any other suitable process for incorporating the electrical or electronic circuitry onto or into the ceramic substrate.

In order to aid in the excising of the cut ceramic wafer from the Mylar® tape backing, it is desirable to incorporate a parting agent at the surface of the tape before the ceramic coating is applied to the tape.

Figure 3:
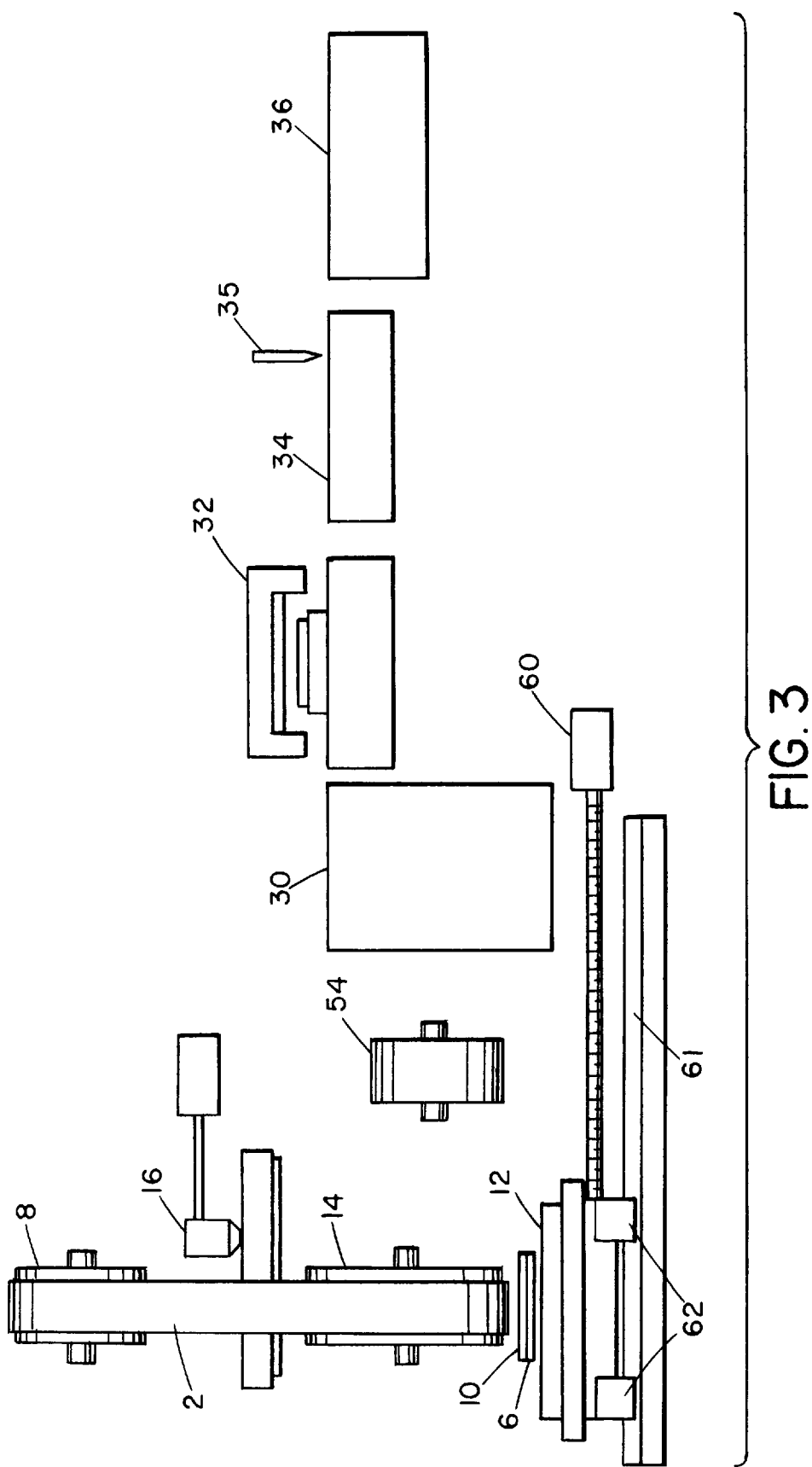
FIG. 3 is a pictorial side elevation view illustrating the apparatus of FIG. 1 in more detail.

The present invention also allows for the incorporation of "cover sheets" into the laminated stack, commonly on the top and bottom but also if desired into the interior of the stack. A cover sheet is a bare ceramic substrate; i.e., one on which there is no electrical circuitry printed. It is conventional to have a few layers (perhaps 3–5) of cover sheets on the top and bottom of such laminated devices. This is achieved by use of the unprinted or blank tape 52, as discussed briefly above. The stack is simply indexed over into alignment with tape 52 when cover layer buildup is needed, via a suitable motor and lead screw assembly 60. As illustrated in FIGS. 3 and 4, platen 12 is slidably mounted on slide rails 61 via slide blocks 62. The platen can thus be aligned with blank tape 52, and the same operation as described above in connection with tape 2 is carried out to tack and excise one or more leaves or wafers of blank tape onto the stack.

Thus, wafers of unprinted tape 52 pass through the system in the same manner as all of the other wafers and they are processed in exactly the same way at the platen with the lamination, tacking and stacking of the excised layers, with the sole exception that those wafers do not have any electrical circuitry printed on them. Similarly, it is of course equally feasible to have such blank or cover sheets inserted into the laminate at different positions by simply indexing to unprinted roll 52 and tacking to layers below. Thus this invention has the advantage that no change in operation of the equipment or process needs to be made to produce both covers sheets and patterned substrates, other than the routine one of indexing the platen to areas of the ceramic layer of unprinted tape 52 which are intended to be blank.

Once the perimeter of the ceramic layer is cut by the cutting blade 26, the excised leaf can be pulled away from the tape backing by the action of the platen 12. Alternatively, the platen can be moved to one side of the first contact point still in registration with the tape, as illustrated by FIG. 5, and a worker tending the equipment can simply peel the tape backing from the excised leaf by hand, thus freeing the platen 12 with the new leaf attached to the stack to be returned for excising of the next sequential leaf. The automatic mechanized excising and removal of each leaf is of course preferred, but the manual separation of the tape and the leaf may be desirable for use with smaller, low capacity equipment, or where the nature of the overall operation is such that the higher cost of a fully automated self-separation device cannot be justified.

After the stack is built up to the desired thickness, it is then removed from platen 12, dried in dryer 30 and laminated at unit 32, before cutting into individual components or chips using blade 35.

Use of the hydraulic bladder pressure bonding avoids the abrupt application of pressure as was common with prior art units. Not only did the prior art high impact devices create problems with waviness and registration, but they tended to apply the pressure unevenly across the stack of laminates, and therefore had areas which remained unbonded. Uniform bonding and production of consistent laminated devices is also enhanced by this invention, in that while the prior art tried (with only limited success) to align the tape with the platen and stack, the present invention fixes the tape in a predetermined and consistent position, and then brings the platen and stack into alignment and contact with the tape. Since this operation can be repeated consistently, the desired alignment of the individual leaves in the stack is assured.

It is evident that there are numerous embodiments of the present invention which, while not expressly described above, are clearly within the scope and spirit of the invention. The above description is therefore intended to be exemplary only, and the scope of the invention is to be determined solely by the appended claims.

We claim:

1. Apparatus for forming a laminated electrical or electronic device from a continuous tape coated on one side with a ceramic material, comprising:

a vertically movable, horizontally oriented platen for accumulating a stack of substrates;

a tape positioning block located at a fixed vertical position above the platen for releasably positioning sequential indexed segments of a continuous tape in a predetermined position aligned with and spaced above said platen with a ceramic coated side of said tape facing said platen;

cutting means cooperative with said platen for excising a patterned or unpatterned substrate from said ceramic coating of said tape;

drive means for moving said horizontal platen in a vertical direction towards and away from said tape positioning block between a first, lowered position spaced below said tape and a second, raised position in registration and contact with said tape, maintaining registration and contact of said platen with said tape while said cutting means excises said substrate, moving said platen away from said registration with said substrate transferred to said platen, and returning said platen into registration and contact with a next sequential segment of said tape;

control means for operating said positioning means, drive means, and cutting means repetitively whereby a plurality of said substrates is accumulated in a stack on said platen; and lamination means for bonding said plurality of substrates into a unitary laminated pad.

2. Apparatus as in claim 1 further comprising printing means preceding said tape positioning means for printing circuitry on that portion of said ceramic coating which is subsequently excised as a patterned substrate.

3. Apparatus as in claim 1, wherein said lamination means comprises a lamination unit separate from said tape positioning block and platen for bonding said plurality of substrates into a unitary laminated pad.

4. Apparatus as in claim 3 wherein said lamination unit comprises a pressurizing device and said bonding is accomplished by application of pressure to said plurality of substrates.

5. Apparatus as in claim 3, further comprising a cutting station for cutting said laminated pad into a plurality of individual electrical or electronic devices.

6. Apparatus as in claim 1 wherein said cutting means cuts a closed perimeter incision through said ceramic layer, said substrate being defined as the portion of ceramic coating within said perimeter incision.

7. Apparatus as in claim 6 wherein said substrate is generally rectangular in shape.

8. Apparatus as in claim 7, wherein said substrate is square in shape.

9. Apparatus as in claim 1 wherein said platen is rotatable through a predetermined angle of rotation while out of said registration.

10. Apparatus as in claim 9 wherein said angle of rotation is 180°.

11. Apparatus as in claim 10 further comprising printing means preceding said tape positioning means for printing circuitry on sequential portions of said ceramic coating which are subsequently excised as sequential patterned substrates of said plurality, such that rotation through said 180° causes said circuity of each said wafer to be oriented opposite to circuitry of an adjacent patterned substrate of said plurality.

12. Apparatus as in claim 1 wherein said control means comprises means for accumulating and maintaining at least fifty said substrates in alignment prior to bonding.

13. Apparatus as in claim 11 wherein said circuitry comprises a component of a semiconductor.

14. Apparatus as in claim 11 wherein said circuitry comprises a component of a capacitor.

* * * * *